United States Patent [19]

Baudouin et al.

[11] Patent Number: 5,260,601

[45] Date of Patent: * Nov. 9, 1993

[54] EDGE-MOUNTED, SURFACE-MOUNT PACKAGE FOR SEMICONDUCTOR INTEGRATED CIRCUIT DEVICES

[75] Inventors: Daniel A. Baudouin, Missouri City; Ernest J. Russell, Richmond, both of Tex.

[73] Assignee: Texas Instruments Incorporated, Dallas, Tex.

[*] Notice: The portion of the term of this patent subsequent to Dec. 4, 2007 has been disclaimed.

[21] Appl. No.: 578,058

[22] Filed: Sep. 5, 1990

Related U.S. Application Data

[63] Continuation of Ser. No. 168,049, Mar. 14, 1988, Pat. No. 4,975,763.

[51] Int. Cl.⁵ .................... H05K 7/12; H01L 23/50
[52] U.S. Cl. ........................ 257/678; 257/696; 257/701; 257/733; 174/52.4; 174/52.5; 361/783; 361/772; 361/807
[58] Field of Search ............ 437/209, 218, 211, 215, 437/217, 219, 220; 174/52.4, 52.5; 361/400, 401, 403, 405, 412, 413, 397, 404, 407; 29/838; 257/678, 696, 701, 733

[56] References Cited

U.S. PATENT DOCUMENTS

| | | | |
|---|---|---|---|
| 3,873,173 | 3/1975 | Anhalt | 361/403 |
| 4,246,627 | 1/1981 | Poensgen | 361/405 |
| 4,350,856 | 9/1982 | Shiratori et al. | 361/400 |
| 4,574,331 | 3/1986 | Smolley | 361/413 |
| 4,813,642 | 3/1989 | Matsui | 361/403 |
| 4,935,581 | 6/1990 | Komathu | 174/52.4 |
| 4,967,262 | 10/1990 | Farnsworth | 357/80 |
| 4,975,763 | 12/1990 | Baudouin et al. | 357/74 |

FOREIGN PATENT DOCUMENTS

| | | |
|---|---|---|
| 0147039 | 7/1985 | European Pat. Off. . |
| 0179577 | 4/1986 | European Pat. Off. . |
| 0263448 | 12/1985 | Japan . |
| 2091036 | 7/1982 | United Kingdom ............... 174/52.4 |

OTHER PUBLICATIONS

Eighty-Pin Package for FET Chips; J. J. Honn; IBM Tech. Discl. Bulletin; vol. 15, No. 1; Jun. 1972.

Primary Examiner—Rolf Hille
Assistant Examiner—David Ostrowski
Attorney, Agent, or Firm—William E. Hiller; Richard L. Donaldson

[57] ABSTRACT

A flat package for semiconductor integrated circuit devices allows edge-mounting and surface-mount. The package may be molded plastic containing a semiconductor chip, and flat leads extend from one edge of the package. The leads are bent to provide an area to solder to conductors on a PC board. Mechanical positioning, mechanical support and spacing are provided by studs extending from the edge of the package adjacent the leads. The studs have stops formed at a position even with flat outer surfaces of the bent leads; the portion outward of the stops fits into holes in the PC board.

20 Claims, 4 Drawing Sheets

EDGE-MOUNTED, SURFACE-MOUNT PACKAGE FOR SEMICONDUCTOR INTEGRATED CIRCUIT DEVICES

This is a continuation of application Ser. No. 07/168,049, filed Mar. 14, 1988 now U.S. Pat. No. 4,975,763.

BACKGROUND OF THE INVENTION

This invention relates to semiconductor devices, and more particularly to surface-mount packages for integrated circuit devices.

Integrated circuit devices have been housed in dual-in-line plastic packages, referred to as DIP packages, in the bulk of semiconductor manufacture, for many years. These DIP packages have leads which extend through holes in a printed circuit board, and the package itself is mounted flat on the board. More recently surface-mount packaging has been introduced, and this technique eliminates the necessity of soldering leads in holes in PC boards, so the leads and PC baord conductors can be closer together and higher densities are achieved. Similarly, edge-mounted packages or modules have been used in an effort to further increase the density of devices, improve cooling and reduce cost. As the density of devices and circuitry on the chips continues to increase, the packaging density must also increase, both at the package level and at the board level, while at the same time providing adequate cooling, and allowing the assembly and soldering of packages and boards to be fast, accurate and non-destructive. In particular, the packaging technique must provide protection for the leads during test, burn-in, and transport, as well as ease of positioning and mechanical support during mounting and soldering and during the life of the system.

It is a principal object of this invention to provide an improved packaging method for semiconductor integrated circuit devices. Another object is to provide an edge-mounted package for semiconductor devices that does not require soldering of leads into through-holes in a printed circuit board. A further object is to provide a surface-mount package for integrated circuits that is mechanically secure during mounting, soldering and operation, yet does not occupy space on the PC board unnecessarily. Still another object is to provide an edge-mount, surface-mount method for integrated circuit devices that allows the leads to be protected during the time from assembly to final system use, and allows accurate positioning of the leads on a PC board.

SUMMARY OF THE INVENTION

In accordance with one embodiment of the invention, a package for an integrated circuit comprises a flat housing having conductive leads extending from at least one edge, with these leads being bent or otherwise formed to allow them to be soldered to conductors on a printed circuit board in a "surface-mount" manner. To provide mechanical positioning, support and spacing, at least two protruding spacers or studs are located on the same edge of the package as the leads, and these spacers have a lip or mechanical shape to function as a stop to hold the leads in the proper position for soldering. The package can thus be "edge-mounted" to save space on the PC board, while in addition the leads are "surface-mount" type in that holes in the PC for the leads are not needed. Two holes for the studs are used, but these are of a less-critical nature.

BRIEF DESCRIPTION OF THE DRAWINGS

The novel features believed characteristic of the invention are set forth in the appended claims. The invention itself, however, as well as further objects and advantages thereof, will best be understood by reference to the following detailed description of particular embodiments, when read in conjunction with the accompanying drawings, wherein:

DETAILED DESCRIPTION OF SPECIFIC EMBODIMENTS

Figure 1:
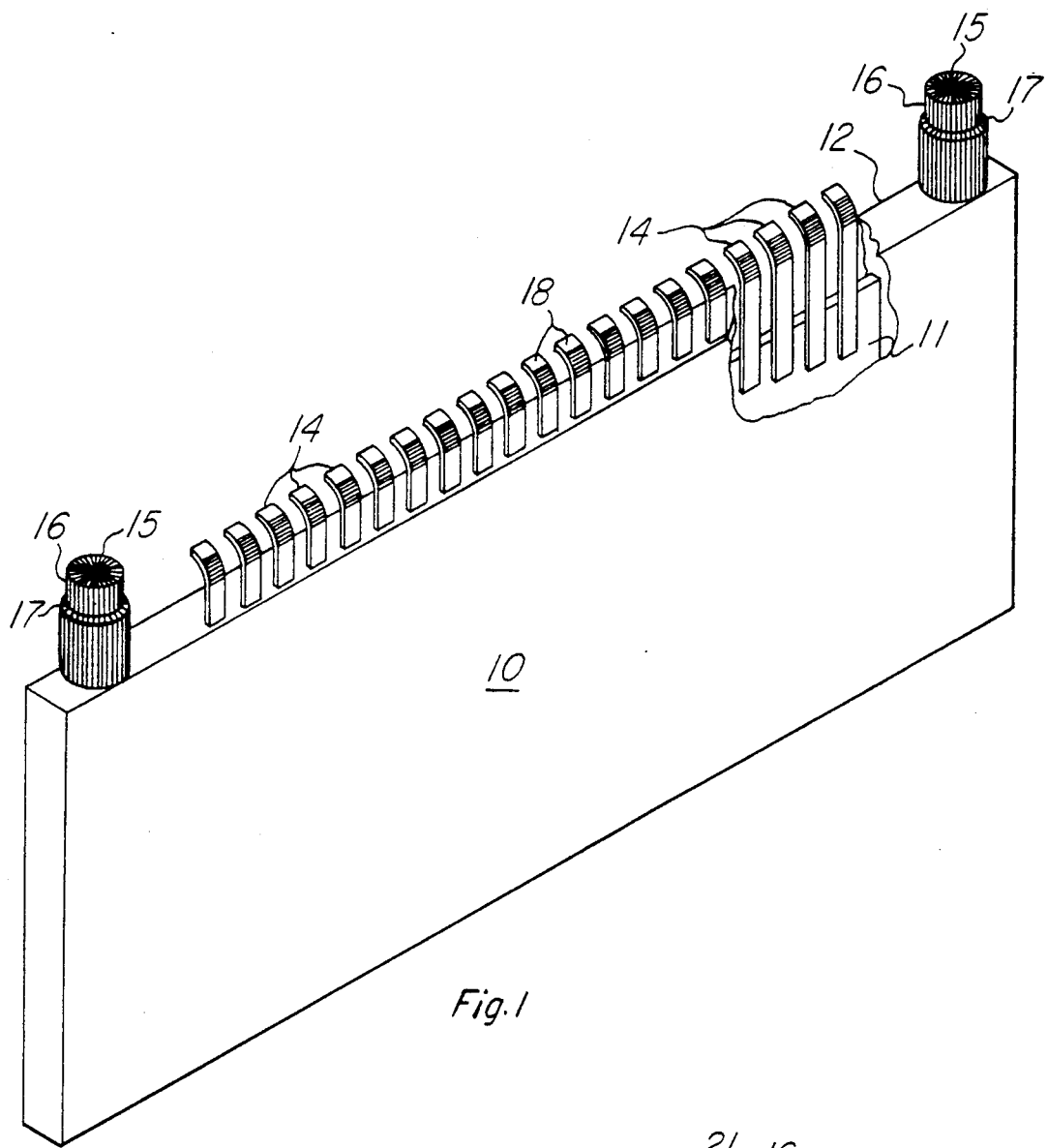
FIG. 1 is a pictorial view, partly broken away, of a package for an integrated circuit device, according to the invention.
Figure 2:
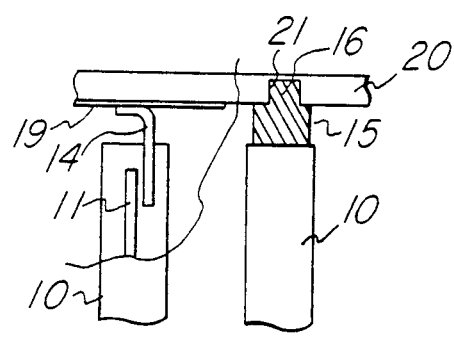
FIG. 2 is an elevation view, partly in section and partly broken away, of the package of FIG. 1 mounted in a printed circuit board.
Figure 3:
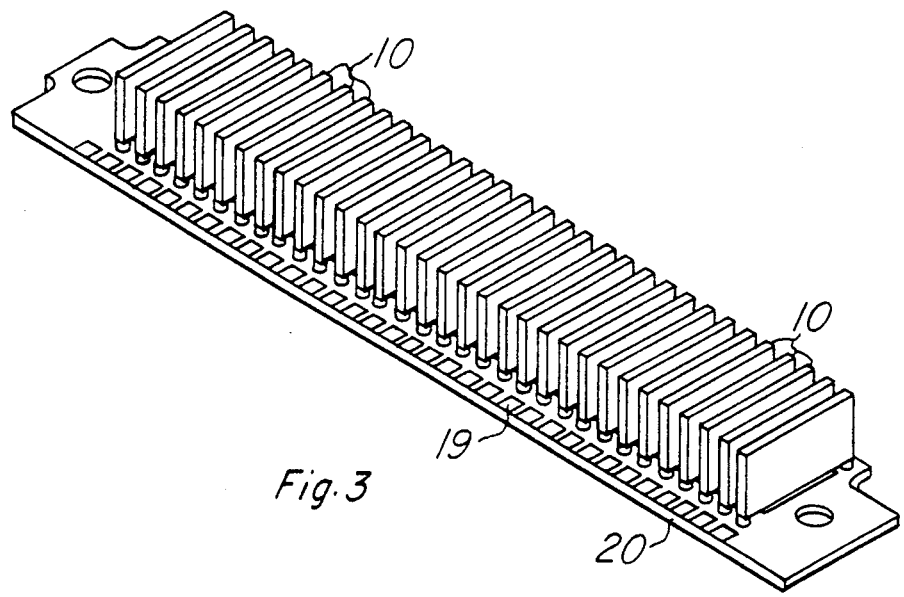
FIG. 3 is a pictorial view of a number of the packages of FIGS. 1 and 2 mounted on a PC board.

Referring now to FIG. 1 of the drawings, a package 10 for an integrated circuit chip 11 is illustrated according to one embodiment of the invention. The package is composed of injection-molded plastic 12 as is commonly used in this industry, and surrounds and contains the silicon chip 11 to provide support and hermetic sealing, as well as to provide a means for connection to conductors on a circuit board or the like. This connection is provided by leads 14, which may be soldered to "bumps" on the chip 10 while the leads are still attached to a lead-frame as will be described. Alternatively, the leads may be connected to bonding pads on the chip 11 by wire bonding in the conventional manner. According to the invention, a pair of protruding studs or spacers 15 are positioned on the same edge of the flat package 10 as the leads 14. These studs or spacers are composed of molded plastic, just like the remainder of the package, and are formed at the same time as the package itself. The spacers include reduced-diameter cylindrical portions 16 for insertion into holes in the printed circuit board where the device is to be mounted, and include lip or stop portions 17 coplanar with the flat surfaces 18 of the leads 14 so that the leads will be positioned for soldering to the conductors 19 on the printed circuit board 20 as seen in FIGS. 2 and 3. The package 10 is mechanically supported and positioned by the cylindrical portions 16 fitting into holes 21 in the PC board 20.

In FIG. 2, a completed PC board assembly using the integrated circuit packages of FIG. 1 is illustrated. If the devices 10 are 1-Mbit or 4-Mbit DRAMs, for example, the assembly of FIG. 2 would provide thirty-two or 128 megabits of memory for a computer or the like, in a physical size of about $1 \times 2 \times 8$ inches. The vertical positioning of the packages 10, with both flat faces free, provides excellent cooling.

Figure 4:
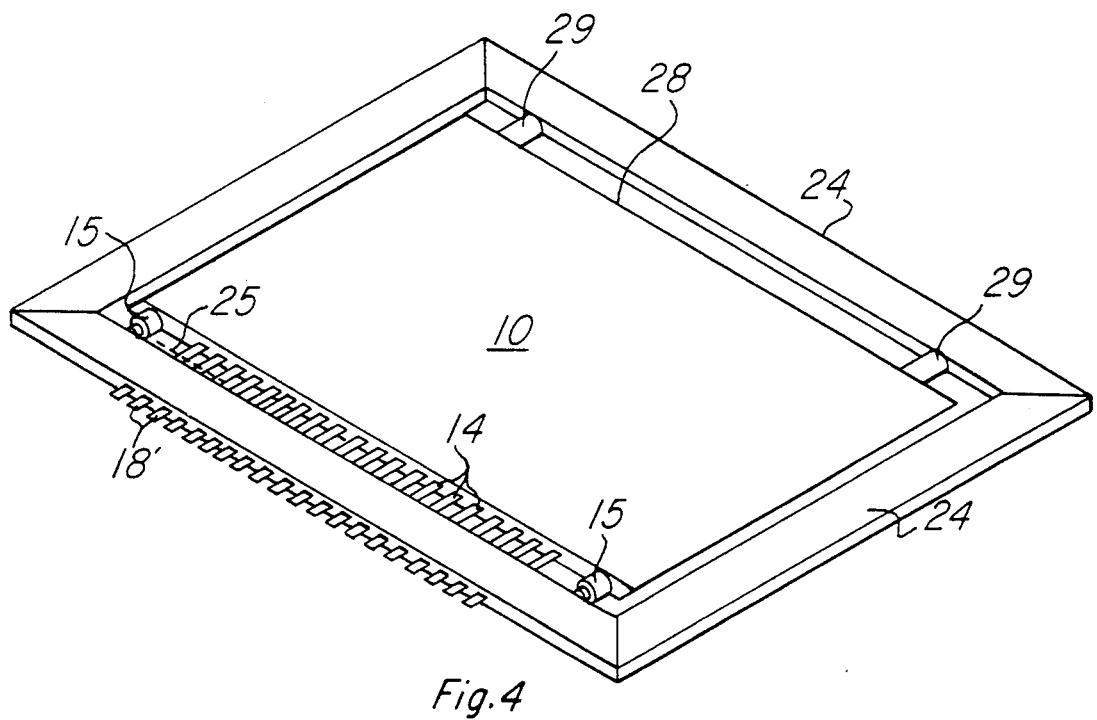
FIG. 4 is a plan view of the package of FIG. 1 while still surrounded by a frame used in the manufacture thereof.

Referring now to FIG. 4, a preferred way of making the package 10 of FIG. 1 is to mold a frame 24 around the package at the same time as the plastic package itself is molded. This frame 24 surrounds the package 10 and is as thick as or thicker than the package. The leads 14 extend through the frame 24 and are formed in a shape suitable for testing and burn-in; that is, the leads 14 are shown in FIG. 4 in a form prior to having been cut and bent to the final form as seen in FIG. 1, but instead are shaped at their outer ends 18' to be exposed for electrical contact exterior to the frame 24. Ultimately, the leads 14 are cut along the line 25 and bent to the shape of FIG. 1. The purpose of the frame 24 is to provide mechanical protection to the package 10 and leads 14; this protection is due to the dimensions of the frame and due to the fact that all testing and burn-in connections as well as mechanical handling are effected to the frame 24 or on the part 26 of the leads 14 outside the frame 24, thus leaving the package 10 and leads 14 inside the frame unmolested. Just before assembly the frame 24 is trimmed away from the package 10. To provide additional mechanical support during handling, the edge 28 of the package 10 may have plastic studs 29 extending to the frame 24; these would be clipped when the leads 14 are clipped, and so would not be part of the final package as it is seen in FIG. 1.

Figure 5:
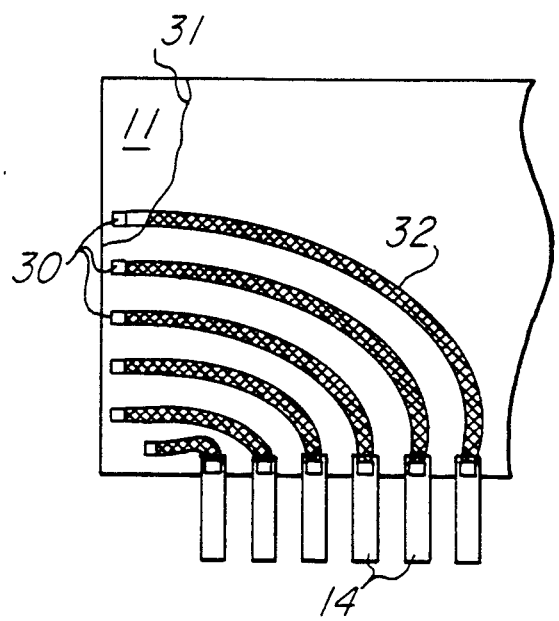
FIG. 5 is a view of a semiconductor chip before it is molded into the package of FIG. 1.

Turning now to FIG. 5, the chip 11 is shown to have bonding pads 30 formed in the usual manner when the upper level of metallization is applied. These bonding pads correspond to the ones usually having leads bonded thereto in the more traditional packaging methods. Instead, another layer of insulator 31 is added, and patterned using photoresist to open holes over the bonding pads 30, then an additional metal layer is applied and patterned to leave traces 32 running over to the edge where the leads 14 are to be connected. Solder bumps are applied to the ends of the traces 32 to accomadate the leads 14, which may be bonded to the solder bumps while in the same jig used to hold the assembly while the frame 24 and plastic body 10 are being molded; in this manner, the chip and leads need not be handled at a time when the leads are not mechanically secure.

Figure 6:
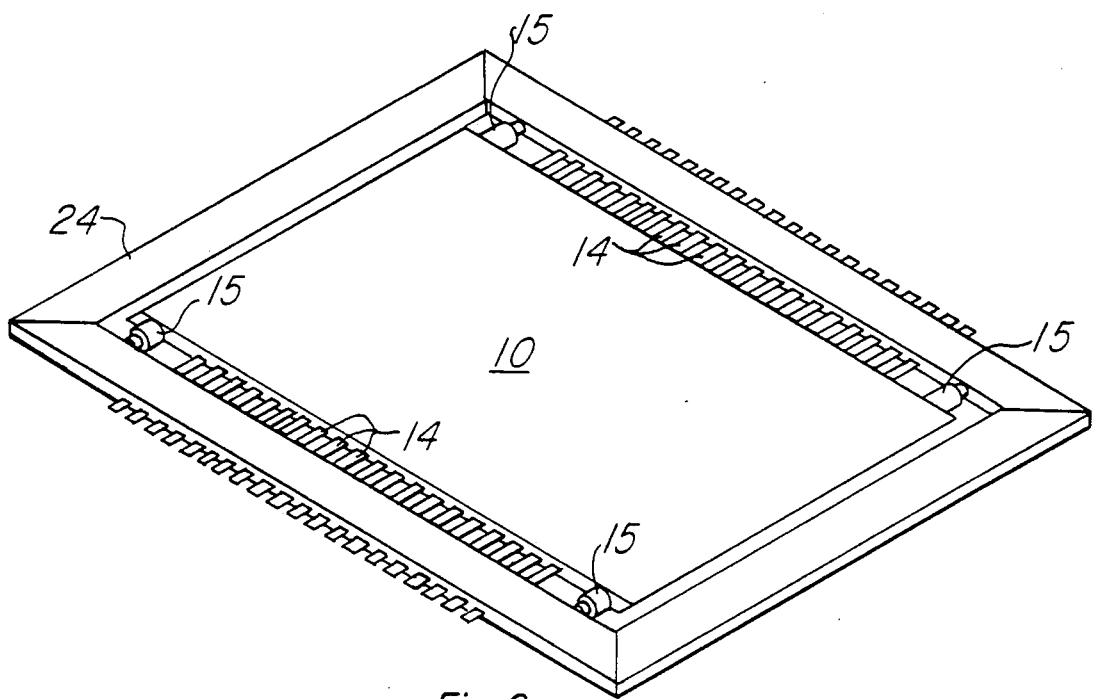
FIG. 6 is a pictorial view of another embodiment of the package of FIG. 1, in this case having leads extending from opposite edges, while still in the frame as in FIG. 4.
Figure 7:
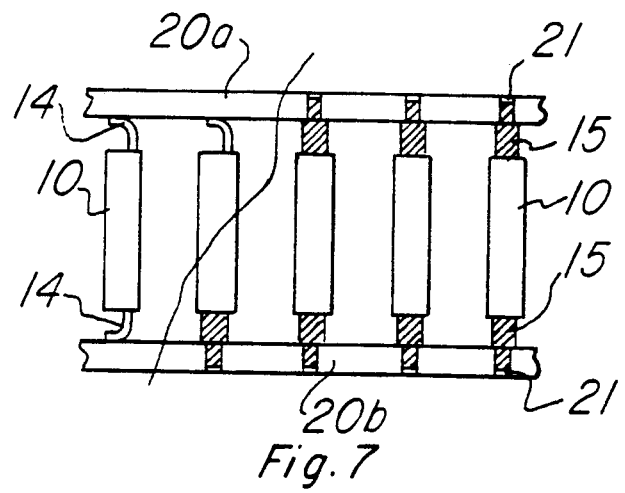
FIG. 7 is an elevation view of the embodiment of the invention of FIG. 6, mounted between two PC boards.

In another embodiment, the package 10 of the invention may be formed with leads 14 on both upper and lower sides, as seen in FIG. 6. This double-sided edge-mounted package would be mounted between two printed circuit boards 20a and 20b as seen in FIG. 7. This embodiment may be useful if the integrated circuit device has a large number of leads; microprocessor devices or application-specific (ASIC) devices may have, for example, forty-eight, sixty-four, or more, of the leads 14. Or, alternatively, the package 10 may have the studs 15 on both opposite edges as seen in FIG. 6, but have leads 14 extending from only one edge, so that electrical connection is made to only one of the boards 20a or 20b of FIG. 7 and the other board is a copper heat sink and ground plane; there may be leads 14 for ground connections, but no logic connections, extending from the edge near the copper ground plane. Another advantage of the configuration of FIG. 7 is that the packages act as air paths so air blown through the assembly for cooling will be confined along the desired paths from one side to the other.

Figure 8:
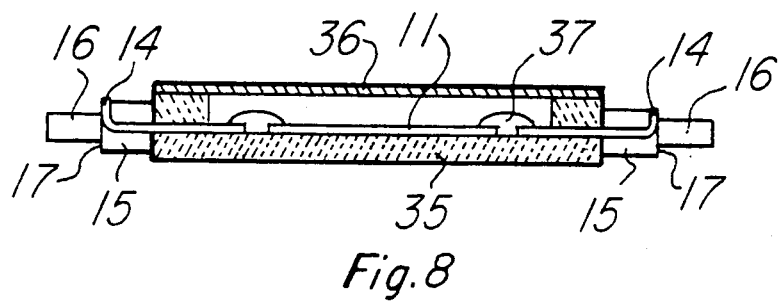
FIG. 8 is an elevation view in section of another embodiment of the invention using a ceramic package instead of a plastic package.

Although described above in reference to plastic encapsulated packages 10, the concept of the invention may be utilized in ceramic packaged devices as illustrated in FIG. 8. Here a caramic header 35 has the leads 14 sealed therein; the leads 14 extend through the shallow walls of the package and are bent as before to allow surface mount. Studs 15 are made of metal or plastic and are brazed or adhesively bonded to the edges of the package to create the same physical shape as in FIG. 1. A metal lid 36 seals the package as is usual for ceramic semiconductor packages. Wires 37 are bonded between bonding pads on the chip 11 and the inner ends of the leads 14.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A surface mount integrated circuit structure, comprising:
   a printed circuit board having a surface for mounting integrated circuit devices, the surface having apertures for receiving nonconductive portions of the integrated circuit devices; and
   a semiconductor integrated circuit device having a relatively flat nonconductive package encapsulating a semiconductor chip, a plurality of conductive leads extending from one edge of the package, and a plurality of nonconductive studs extending from the one edge of the package that are shaped to fit into the apertures of the printed circuit board for mechanically positioning and supporting the package when the conductive leads are soldered to the printed circuit board.

2. The structure of claim 1 wherein the conductive leads are bent to present a face generally perpendicular to the relatively flat package.

3. The structure of claim 1 wherein the nonconductive studs have a stop on them to limit the extension of the studs into the printed circuit board and provide a selected spacing between the edge of the package and the printed circuit board.

4. The structure of claim 3 wherein the conductive leads are bent to present a face generally perpendicular to the printed circuit board and aligned with said stop.

5. The structure of claim 2 wherein the nonconductive package is a plastic package.

6. The structure of claim 4 wherein the nonconductive package is a plastic package.

7. An integrated circuit surface mount structure, comprising:
   a printed circuit board having a surface for mounting integrated circuit devices, the surface having apertures for receiving nonconductive supporting parts of the integrated circuit devices; and
   an integrated circuit device having an integrated circuit encapsulated by a nonconductive generally flat package, a plurality of conductive leads along one edge of the package extending into the package and connected to the integrated circuit, and a plurality of integral studs along the edge of the package shaped to fit into the apertures of the printed circuit board for mechanically positioning and supporting the package when the conductive leads are soldered to the printed circuit board.

8. The structure of claim 7 wherein the nonconductive generally flat package is a plastic package.

9. The structure of claim 8 wherein the the studs have spacers on them to limit the extension of the studs into the apertures and to provide a selected spacing between the edge of the package and the printed circuit board.

10. The structure of claim 9 wherein the conductive leads are shaped in alignment with the spacers so that the conductive leads relatively abut the surface of the printed circuit board when the studs of the package are inserted into the apertures of the printed circuit board.

11. A vertically oriented semiconductor package, designed for surface mounting on one of a pair of planar surfaces of a printed circuit board, said package comprising:
    a body having a pair of substantially parallel, vertical planar sides, lower and upper horizontal edges and a substantially vertical edge at each end of the package;
    a semiconductor die having a face on which integrated circuitry is constructed, said die being encapsulated within said body such that said face is positioned between and substantially parallel to the vertical planar sides of said body;
    a plurality of inline leads, each of which is electrically connected, within said body, to a portion of the circuitry on said die, and each of which extends in a downward direction through the lower edge of said body, below which it is bent such that it is disposed against the planar surface of the circuit board when the package is in a mounted position thereupon;
    at least one downward-facing anchoring pin integral with said body at each end thereof; and
    means for securely attaching each anchoring pin to the circuit board in order to maintain a mounted position thereupon during solder reflow operations.

12. The semiconductor package of claim 11, wherein said means for securely attaching comprises a nub on the end of each anchoring pin which is secured within a recess in said circuit board.

13. The semiconductor package of claim 12, wherein each of said anchoring pins has a shoulder that is larger than the diameter of the recesses in said circuit board which seats against said one planar surface of said circuit board.

14. The semiconductor package of claim 11, wherein said means for securely attaching comprises an extension on the end of each anchoring pin which, when said anchoring pins are inserted from said one surface through holes in said circuit board that are properly aligned and properly sized for a forced insertion fit, said extensions are frictionally locked in said holes.

15. The semiconductor package of claim 14, wherein each of said anchoring pins has a shoulder that is larger than the diameter of its corresponding hole in said circuit board, said shoulder seating against said one planar surface of said circuit board.

16. A semiconductor integrated circuit device package assembly comprising:
    a printed circuit board having a planar major surface with electrically conductive areas thereon;
    a body having a pair of substantially parallel, vertical planar sides, lower and upper horizontal edges and a substantially vertical edge at each end thereof;
    a semiconductor substrate having a face on which integrated circuitry is constructed;
    said semiconductor substrate being encapsulated within said body such that said face of said semiconductor substrate is positioned between and substantially parallel to the vertical planar sides of said body and defining therewith a semiconductor device package;
    a plurality of conductive leads extending from at least one horizontal edge of said body, at least some of said plurality of conductive leads being electrically connected within said body to a portion of the integrated circuitry on said semiconductor substrate;
    each of said plurality of conductive leads respectively including an outer contact portion engaging an electrically conductive area on said planar surface of the circuit board when the semiconductor device package is in a vertically mounted position thereupon;
    at least one anchoring member mounted on said body and extending from said at least one horizontal edge of said body; and
    means for securely attaching each anchoring member to the circuit board in order to maintain a vertically mounted position of said semiconductor device package thereupon during solder reflow operations.

17. A semiconductor integrated circuit device package assembly as set forth in claim 16, wherein the outer contact portion of each of said plurality of conductive leads is angularly disposed with respect to the remainder of the corresponding conductive lead.

18. A semiconductor integrated circuit device package assembly as set forth in claim 16, wherein said body is made of molded plastic, and
    said at least one anchoring member is of molded plastic integral with said body.

19. A semiconductor integrated circuit device package assembly as set forth in claim 18, wherein said at least one anchoring member comprises an anchoring pin integral with said body at each end thereof; and
    said means for securely attaching comprises a nub on the end of each anchoring pin and of reduced size with respect to the remainder of the anchoring pin which nub is secured within a recess in said circuit board.

20. A semiconductor integrated circuit device package assembly as set forth in claim 19, wherein each of said anchoring pins has a shoulder defined thereon between the nub of reduced size and the remainder of the anchoring pin, the shoulder on each anchoring pin being larger than the diameter of the respective recesses in said circuit board and seating against said planar surface of said circuit board.

* * * * *